(12) United States Patent
Lee

(10) Patent No.: US 12,727,355 B2
(45) Date of Patent: Sep. 1, 2026

(54) OVERHANG PATTERN FOR ADVANCED OLED PATTERNING

(71) Applicant: Applied Materials, Inc., Santa Clara, CA (US)

(72) Inventor: Jungmin Lee, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 340 days.

(21) Appl. No.: 18/643,809

(22) Filed: Apr. 23, 2024

(65) Prior Publication Data

US 2025/0248261 A1 Jul. 31, 2025

Related U.S. Application Data

(60) Provisional application No. 63/626,920, filed on Jan. 30, 2024.

(51) Int. Cl.

*H10K 59/173* (2023.01)
*H10K 59/12* (2023.01)
*H10K 59/122* (2023.01)

(52) U.S. Cl.

CPC ....... *H10K 59/173* (2023.02); *H10K 59/1201* (2023.02); *H10K 59/122* (2023.02)

(58) Field of Classification Search

CPC . H10K 59/173; H10K 59/1201; H10K 59/122
See application file for complete search history.

(56) References Cited

U.S. PATENT DOCUMENTS 6,060,728 A 5/2000 Ghosh et al.
6,137,220 A 10/2000 Nagayama et al.
6,476,988 B1 11/2002 Yudasaka
8,686,629 B2 4/2014 Oh et al.
(Continued)

FOREIGN PATENT DOCUMENTS

CN 105742311 A 7/2016
CN 106876331 A 6/2017
(Continued)

OTHER PUBLICATIONS

PCT/US2024/019349, International Search Report and Written Opinion dated Jun. 28, 2024, 9 pages. (APPM//44022354PC).
(Continued)

*Primary Examiner* — Richard A Booth
(74) *Attorney, Agent, or Firm* — Patterson + Sheridan, LLP

(57) ABSTRACT

Embodiments described herein relate to a device. The device includes a substrate, a plurality of overhang structures disposed over the substrate, and a plurality of sub-pixels. Each overhang structure includes a first structure, a second structure disposed over the first structure, and adjacent overhangs. The first structure includes an upper section and a lower section. The upper section includes a sidewall parallel to a surface normal of the substrate. The lower section includes a top surface with a first width equal to a second width of a lower surface of the upper section and a lower surface of the first structure having a third width greater than the second width of the lower surface of the upper section. The adjacent overhangs are defined by an overhang extension of the second structure extending laterally past the upper surface of the first structure.

20 Claims, 10 Drawing Sheets

(56) References Cited

U.S. PATENT DOCUMENTS

| | | | |
|---|---|---|---|
| 8,987,717 | B2 | 3/2015 | Kang |
| 9,324,962 | B2 | 4/2016 | Kim |
| 9,337,244 | B2 | 5/2016 | Hatano et al. |
| 10,170,526 | B1 | 1/2019 | Yang |
| 10,580,843 | B2 | 3/2020 | Zhao et al. |
| 10,615,231 | B2 | 4/2020 | Wu et al. |
| 11,348,983 | B1 | 5/2022 | Choung et al. |
| 2002/0014836 | A1 | 2/2002 | Codama et al. |
| 2002/0127478 | A1 | 9/2002 | Weaver et al. |
| 2003/0006697 | A1 | 1/2003 | Weaver |
| 2006/0170340 | A1 | 8/2006 | Tzen et al. |
| 2009/0009069 | A1 | 1/2009 | Takata |
| 2012/0217516 | A1 | 8/2012 | Hatano et al. |
| 2012/0228603 | A1 | 9/2012 | Nakamura |
| 2014/0103385 | A1 | 4/2014 | Hatano et al. |
| 2014/0131743 | A1 | 5/2014 | Jiang et al. |
| 2015/0162563 | A1 | 6/2015 | Ide et al. |
| 2019/0058020 | A1 | 2/2019 | Tsai et al. |
| 2019/0088730 | A1 | 3/2019 | Lee et al. |
| 2019/0348482 | A1 | 11/2019 | Bae et al. |
| 2020/0119114 | A1 | 4/2020 | Kim et al. |
| 2021/0135150 | A1 | 5/2021 | Wang et al. |
| 2021/0397302 | A1 | 12/2021 | Yang et al. |
| 2023/0263012 | A1 | 8/2023 | Chen et al. |
| 2023/0371315 | A1 | 11/2023 | Lee et al. |
| 2024/0260440 | A1* | 8/2024 | Lee ...................... H10K 71/621 |
| 2025/0048844 | A1* | 2/2025 | Lee .................... H10K 59/1201 |

FOREIGN PATENT DOCUMENTS

| | | | |
|---|---|---|---|
| JP | 2016225319 | A | 12/2016 |
| WO | 2022050984 | A1 | 3/2022 |
| WO | 2022225657 | A1 | 10/2022 |

OTHER PUBLICATIONS

PCT/US2025/011019, International Search Report and Written Opinion dated May 12, 2025, 11 pages.

International Search Report/Written Opinion issued to PCT/US2021/021097 on Jul. 1, 2021.

International Search Report/Written Opinion issued to PCT/US2021/021077 on Jun. 23, 2021.

PCT/US2023/011865, International Search Report and Written Opinion dated Jun. 13, 2023, 13 pages.

* cited by examiner

OVERHANG PATTERN FOR ADVANCED OLED PATTERNING

CROSS-REFERENCE TO RELATED APPLICATIONS

This application claims benefit of U.S. provisional patent application Ser. No. 63/626,920, filed Jan. 30, 2024, which is herein incorporated by reference.

BACKGROUND

Field

Embodiments described herein generally relate to a display. More specifically, embodiments described herein relate to sub-pixel circuits and methods of forming sub-pixel circuits that may be utilized in a display such as an organic light-emitting diode (OLED) display.

Description of the Related Art

Input devices including display devices may be used in a variety of electronic systems. An organic light-emitting diode (OLED) is a light-emitting diode (LED) in which the emissive electroluminescent layer is a film of an organic compound that emits light in response to an electric current. OLED devices are classified as bottom emission devices if light emitted passes through the transparent or semi-transparent bottom electrode and substrate on which the panel was manufactured. Top emission devices are classified based on whether or not the light emitted from the OLED device exits through the lid that is added following the fabrication of the device. OLEDs are used to create display devices in many electronics today. Today's electronics manufacturers are pushing these display devices to shrink in size while providing higher resolution than just a few years ago.

OLED pixel patterning is currently based on a process that restricts panel size, pixel resolution, and substrate size. Rather than utilizing a fine metal mask, photo lithography should be used to pattern pixels. Currently, OLED pixel patterning requires lifting off organic material after the patterning process. When lifted off, the organic material leaves behind a particle issue that disrupts OLED performance. Accordingly, what is needed in the art are sub-pixel circuits and methods of forming sub-pixel circuits to increase pixel-per-inch and provide improved OLED performance.

SUMMARY

In one embodiment, a device is disclosed. The device includes a substrate, a plurality of overhang structures disposed over the substrate, and a plurality of sub-pixels. Each overhang structure includes a first structure, a second structure disposed over an upper surface of the first structure, and adjacent overhangs. The first structure includes an upper section and a lower section. The upper section includes a sidewall parallel to a surface normal of the substrate, and an upper surface of the first structure. The lower section includes a top surface with a first width equal to a second width of a lower surface of the upper section and a lower surface of the first structure having a third width greater than the second width of the lower surface of the upper section and extending a first distance past an upper surface of the first structure. The adjacent overhangs are defined by an overhang extension of the second structure extending laterally past the upper surface of the first structure. The overhang extension of the second structure extends a second distance past the upper surface of the first structure. The first distance is equal to the second distance. Each sub-pixel includes an anode, an organic light emitting diode (OLED) material disposed over the anode, and a cathode disposed over the OLED material.

In another embodiment, a device is disclosed. The device includes a substrate, a plurality of overhang structures disposed over the substrate, and a plurality of sub-pixels. Each overhang structure includes a first structure, a second structure disposed over an upper surface of the first structure, and adjacent overhangs. The first structure includes an upper surface, a lower surface, and a plane of a sidewall. The upper surface has a first width greater than a second width of the first structure at the plane. The lower surface has a third width greater than the second width of the first structure at the plane. Each overhang is defined by an overhang extension of the second structure extending laterally past an upper surface of the first structure. Each sub-pixel includes an anode, an organic light emitting diode (OLED) material disposed over the anode, and a cathode disposed over the OLED material.

In another embodiment, a device is disclosed. The device includes a substrate, a plurality of overhang structures disposed over the substrate, and a plurality of sub-pixels. Each overhang structure includes a first structure, a second structure disposed over an upper surface of the first structure, and adjacent overhangs. The first structure includes an upper surface, and a lower surface. The lower surface has a width greater than the upper surface. Each overhang is defined by an overhang extension of the second structure extending laterally past an upper surface of the first structure. Each sub-pixel includes an anode, an organic light emitting diode (OLED) material disposed over the anode, and a cathode disposed over the OLED material.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments described herein generally relate to a display. More specifically, embodiments described herein relate to sub-pixel circuits and methods of forming sub-pixel circuits that may be utilized in a display such as an organic light-emitting diode (OLED) display.

Each of the embodiments described herein of the sub-pixel circuit include a plurality of sub-pixels with each of the sub-pixels defined by adjacent overhang structures that are permanent to the sub-pixel circuit. While the Figures depict two sub-pixels with each sub-pixel defined by adjacent overhang structures, the sub-pixel circuit of the embodiments described herein include a plurality of sub-pixels, such as two or more sub-pixels. Each sub-pixel has OLED materials configured to emit a white, red, green, blue or other color light when energized. E.g., the OLED materials of a first sub-pixel emits a red light when energized, the OLED materials of a second sub-pixel emits a green light when energized, and the OLED materials of a third sub-pixel emits a blue light when energized.

The overhangs are permanent to the sub-pixel circuit and include at least a second structure disposed over a first structure. The adjacent overhang structures defining each sub-pixel of the sub-pixel circuit of the display provide for formation of the sub-pixel circuit using deposition techniques, such as evaporation deposition, and provide for the overhang structures to remain in place after the sub-pixel circuit is formed. Evaporation deposition may be utilized for deposition of OLED materials (including a hole injection layer (HIL), a hole transport layer (HTL), an emissive layer (EML), and an electron transport layer (ETL)), and cathode. In one embodiment, the HIL layer has a greater conductivity than the HTL layer. In another embodiment, the HIL layer has a greater energy level than the HTL layer. In some instances, an encapsulation layer may be disposed via evaporation deposition. In embodiments including one or more capping layers, the capping layers are disposed between the cathode and the encapsulation layer. The overhang structures and the deposition angle set by the deposition source provide for a shadowing effect during deposition with the deposition angle set by the deposition source. In order to deposit at a particular angle, the deposition source is configured to emit the deposition material at a particular angle with regard to the overhang structure. The encapsulation layer of a respective sub-pixel is disposed over the cathode with the encapsulation layer extending under at least a portion of each of the adjacent overhang structures and along a sidewall of each of the adjacent overhang structures.

Figure 1A:
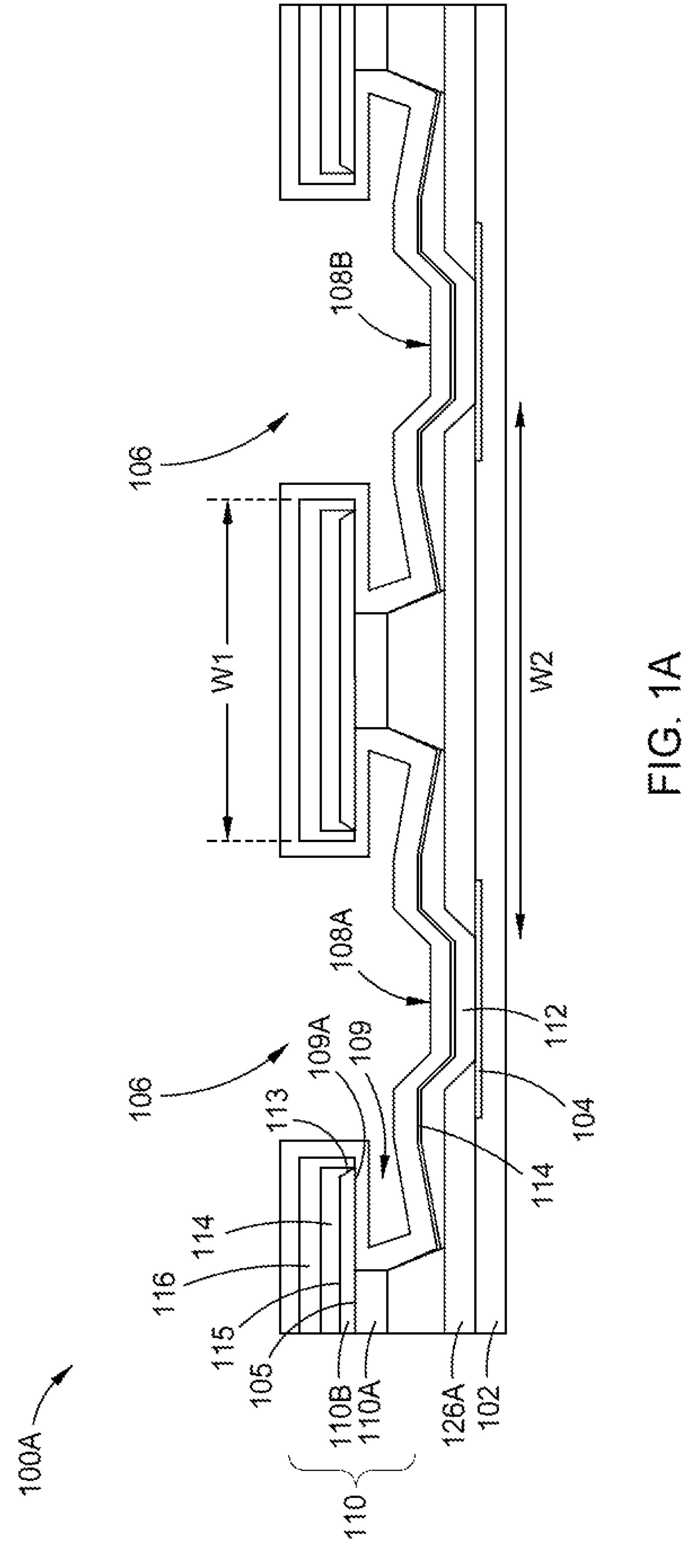
FIG. 1A is a schematic, cross-sectional view of a sub-pixel circuit according to embodiments.
Figure 1B:
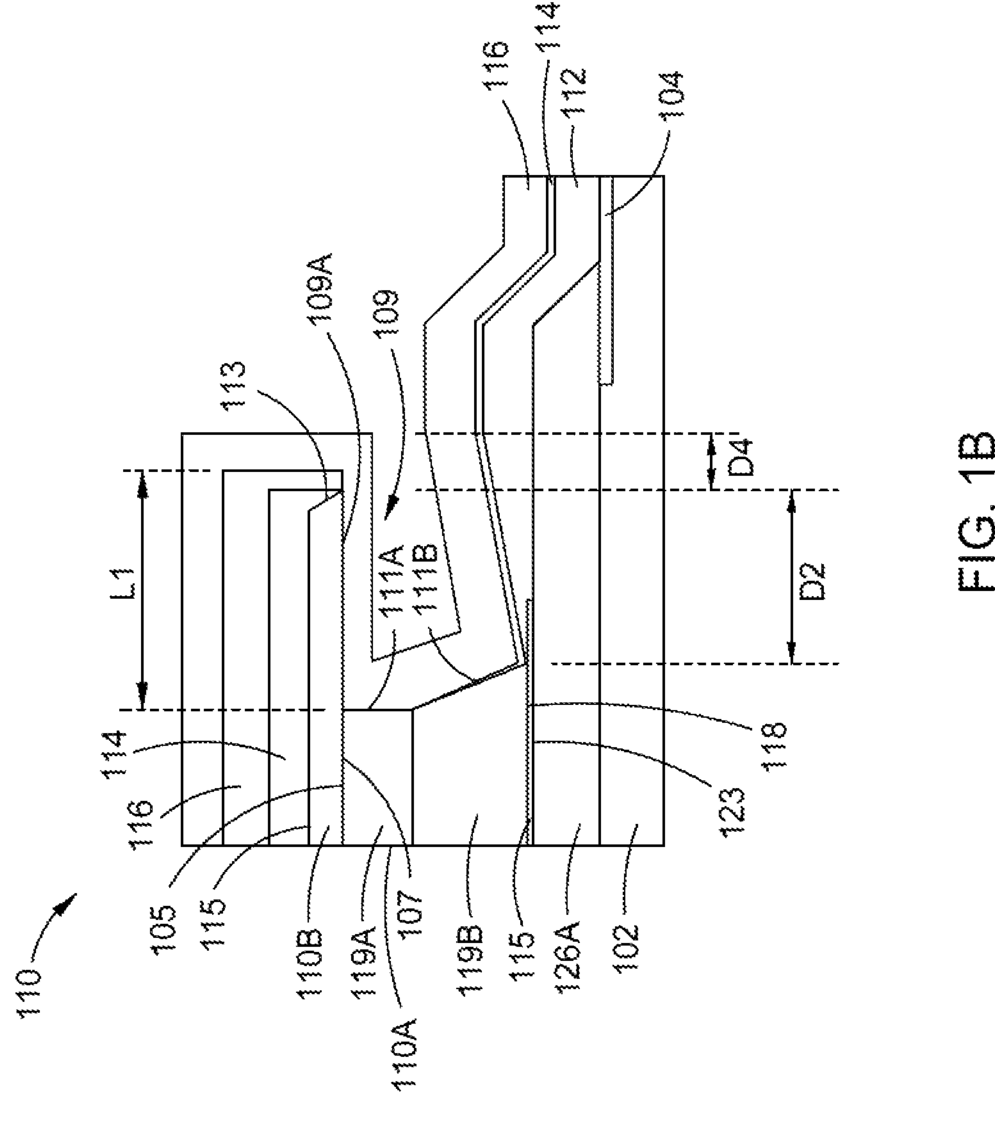
FIG. 1B is a schematic, cross-sectional view of an overhang structure of a sub-pixel circuit according embodiments.

FIG. 1A is a schematic, cross-sectional view of a first sub-pixel circuit 100A according to embodiments. FIG. 1A corresponds to a cross-section of the first sub-pixel circuit 100A. FIG. 1B is a schematic, cross-sectional view of an overhang structure 110 of the first sub-pixel circuit 100A according to embodiments. The first sub-pixel circuit 100A includes a substrate 102. Metal-containing layers 104 may be patterned on the substrate 102 and are defined by adjacent pixel structures (PS) 126A disposed over the substrate 102. In one embodiment, the PS 126A is disposed on the substrate 102. In one embodiment, the metal-containing layers 104 are pre-patterned on the substrate 102. E.g., the substrate 102 is pre-patterned with metal-containing layers 104 of indium tin oxide (ITO). The metal-containing layers 104 are configured to operate as anodes of respective sub-pixels. In one embodiment, the metal-containing layer 104 is a layer stack of a first transparent conductive oxide (TCO) layer, a second metal-containing layer disposed on the first TCO layer, and a third TCO layer disposed on the second metal-containing layer. The metal-containing layers 104 include, but are not limited to, chromium, titanium, gold, silver, copper, aluminum, ITO, a combination thereof, or other suitably conductive materials.

The PS 126A are disposed over the substrate 102. The PS 126A include one of an organic material, an organic material with an inorganic coating disposed thereover, or an inorganic material. The organic material of the PS 126A includes, but is not limited to, polyimides. The inorganic material of the PS 126A includes, but is not limited to, silicon oxide ($SiO_2$), silicon nitride ($Si_3N_4$), silicon oxynitride ($Si_2N_2O$), magnesium fluoride ($MgF_2$), or combinations thereof. The PS 126A has a width W2. The width W2 is less than about 700 nm, such as about 100 nm to about 700 nm. Adjacent PS 126A define a respective sub-pixel and expose the anode (i.e., metal-containing layer 104) of the respective first sub-pixel circuit 100A.

The first sub-pixel circuit 100A has a plurality of sub-pixels 106 including at least a first sub-pixel 108A and a second sub-pixel 108B. While the Figures depict the first sub-pixel 108A and the second sub-pixel 108B, the first sub-pixel circuit 100A of the embodiments described herein may include two or more sub-pixels 106, such as a third and a fourth sub-pixel. Each sub-pixel 106 has OLED materials configured to emit a white, red, green, blue or other color light when energized. E.g., the OLED materials of the first sub-pixel 108A emits a red light when energized, the OLED materials of the second sub-pixel 108B emits a green light when energized, the OLED materials of a third sub-pixel emits a blue light when energized, and the OLED materials of a fourth sub-pixel emits another color light when energized.

Each sub-pixel 106 includes an overhang structure 110. The overhang structures 110 are permanent to the first sub-pixel circuit 100A. The overhang structures 110 further define each sub-pixel 106 of the first sub-pixel circuit 100A. Each overhang structure 110 includes adjacent overhangs 109. The adjacent overhangs 109 are defined by an overhang extension 109A of a second structure 110B extending laterally past a first structure 110A. The second structure 110B is disposed over the first structure 110A. In one embodiment, the second structure 110B is disposed on the first structure 110A. The second structure 110B has a width W1. The width W1 is about 1000 nm or less, such as about 600 nm to about 1000 nm. A lower surface 118 of the first structure 110A is disposed over the substrate 102. In some embodiments, the lower surface 118 of the first structure 110A is disposed over the upper surface 103 of the PS 126A.

The second structure 110B may also be disposed over an intermediate structure. The intermediate structure may be disposed over the upper surface 105 of the first structure 110A. The intermediate structure may be a seed layer or an adhesion layer. The seed layer functions as a current path for the second sub-pixel circuit 100B. The seed layer may include a titanium (Ti) material. The adhesion promotion layer improves adhesion between the first structure 110A and the second structure 110B. The adhesion layer may include a chromium (Cr) material.

In one embodiment, the overhang structures 110 include the second structure 110B of a conductive inorganic material and the first structure 110A of a non-conductive inorganic material. The conductive materials of the second structure 110B include a copper (Cu), chromium (Cr) or chromium oxide ($Cr_2O_3$), aluminum (Al), aluminum neodymium (AlNd), molybdenum (Mo), molybdenum tungsten (MoW), titanium (Ti), or combinations thereof. The non-conductive materials of the first structure 110A include amorphous silicon (a-Si), silicon nitride ($Si_3N_4$), silicon oxide ($SiO_2$), silicon oxynitride ($Si_2N_2O$), or combinations thereof.

In another embodiment, the second structure includes inorganic materials. The inorganic materials of the second structure include titanium (Ti), silicon nitride ($Si_3N_4$), silicon oxide ($SiO_2$), silicon oxynitride ($Si_2N_2O$), or combinations thereof. The first structure includes conductive materials. The conductive materials of the first structure 110A include aluminum (Al), aluminum neodymium (AlNd), molybdenum (Mo), molybdenum tungsten (MoW), copper (Cu), or combinations thereof.

In some embodiments, the first structure 110A includes an upper section 119A and a lower section 119B. The upper section 119A is disposed over the lower section 119B. The upper section 119A and the lower section 119B, in some embodiments, have the same thickness. The lower section 119B has a greater width adjacent to the PS 126A and a lesser width adjacent to the upper section 119A. In some embodiments, a sidewall 111A of the upper section 119A is parallel to a surface normal of the substrate 102. A sidewall 111B of the lower section 119B In other embodiments, the sidewall 111A of the upper section 119A and the sidewall 111B the lower section 119B may be sloped or curved.

The upper section 119A of the first structure 110A is deposited at a first temperature. The first temperature may be from about 100° C. to about 200° C., such as 150° C. The lower section 119B of the first structure 110A is deposited at a second temperature. The second temperature may be from about 250° C. to about 350° C., such as 200° C. The higher deposition temperature of the second silicon material of the lower section 119B may enable a slower etch rate of the lower section 119B of the first structure 110A, resulting in less lateral etching. The second structure 110B is disposed over the upper section 119A of the first structure 110A. The second structure 110B may be disposed on the upper surface 105 of the first structure 110A. In some embodiments, the upper section 119A is an amorphous silicon ($\alpha$-Si) and the lower section 119B is an $\alpha$-Si, a silicon nitride ($SiN_x$), or a silicon oxide ($SiO_2$).

In some embodiments, a passivation layer 123 is disposed over the PS 126A. The first structure 110A is disposed over the passivation layer 123. In particular, the lower section 119B of the first structure 110A is disposed over the passivation layer 123. The passivation layer 123 includes a non-conductive material, such as an aluminum oxide, silicon oxide, or a silicon nitride. The passivation layer is configured to prevent etching of the metal-containing layer 104 and the PS 126A during etching of the overhang structure 110.

In one embodiment, an OLED material 112 is disposed over and in contact with the metal-containing layer 104. In one embodiment, the OLED material 112 is different from the material of the first structure 110A and the second structure 110B. The overhang structures 110 provide for a shadowing effect during deposition at an angle. Deposition angles are set by the deposition source. The deposition source may be an evaporation source. The OLED material 112 and cathode 114 are deposited via evaporation deposition.

Adjacent overhangs 109 are defined by the overhang extension 109A of the second structure 110B. At least a bottom surface 107 of the second structure 110B is wider than an upper surface 105 of the first structure 110A to form the overhang extension 109A of the overhang 109. The bottom surface 107 (e.g., the overhang extension 109A) of the second structure 110B extends a distance D1 past the upper surface 105 of the first structure 110A, and extends a distance D2 past the edge of the lower surface 118 of the first structure 110A. The distance D1 is greater than about 150 nm, such as from about 150 nm to about 200 nm, such as about 170 nm. In some embodiments, the distance D2 is less than about 50 nm, such as less than about 10 nm, such as less than about 5 nm. In some embodiments, the distance D2 is 0 nm, e.g., the lower surface 118 of the first structure 110A extends a distance past the upper surface 105 of the first structure 110A equal to D1. The distance D1 enables a disconnection between the OLED material 112 and cathode 114 deposited on the upper surface 115 of the second structure 110B and the OLED material 112 and cathode 114 deposited on the sidewall 111B of the first structure 110A. The disconnection reduces the likelihood of an anode-cathode short near the overhang structures 110.

The second structure 110B is disposed over an upper surface 105 of the first structure 110A. The overhang extension 109A of the second structure 110B forms the overhang 109 and allows for the second structure 110B to shadow the first structure 110A. The shadowing of the overhang 109 provides for deposition of each of the OLED material 112 and a cathode 114. The OLED material 112 is disposed under the overhang 109. The cathode 114 is disposed over the OLED material 112 and extends under the adjacent overhang 109.

The deposition profile of the OLED material 112 and the cathode 114 may decrease beginning at a distance D4 from the edge of the second structure 110B as the deposition approaches the overhang structures 110. The distance D4 is about 100 nm to about 300 nm from the edge of the bottom surface 107 of the second structure 110B, such as about 200 nm from the edge of the bottom surface 107 of the second structure 110B. The overhang structure 110 minimizes the change in the deposition profile of the OLED material and the cathode 114 as the deposition approaches the overhang structures 110, which reduces the change of leakage within the first sub-pixel circuit 100A.

In one embodiment, the OLED material 112 is disposed over and in contact with the metal-containing layers 104 and the upper surface 103 of the PS 126A. The OLED material 112 is disposed under the adjacent overhangs 109, such that the OLED material 112 contacts the first structure 110A.

The cathode 114 includes a conductive material, such as a metal. E.g., the cathode 114 includes, but is not limited to, silver, magnesium, chromium, titanium, aluminum, ITO, or a combination thereof. In one embodiment, material of the cathode 114 is different from the material of the first structure 110A and the second structure 110B. In some embodiments, the OLED material 112 and the cathode 114 are disposed on the sidewall 111 of the first structure 110A. In some embodiments, the OLED material 112 and the cathode are disposed over the upper surface 115 of the second structure 110B and a sidewall 113 of the second structure 110B.

Each sub-pixel 106 includes an encapsulation layer 116. The encapsulation layer 116 may be or may correspond to a local passivation layer. The encapsulation layer 116 of a respective sub-pixel is disposed over the cathode 114 (and OLED material 112) with the encapsulation layer 116 extending under at least a portion of each of the overhangs 109 and along a sidewall 111 of the first structure 110A and the sidewall 113 of the second structure 110B. The encapsulation layer 116 includes the non-conductive inorganic material, such as the silicon-containing material. The silicon-containing material may include $Si_3N_4$ containing materials.

In embodiments including one or more capping layers, the capping layers are disposed between the cathode 114 and the encapsulation layer 116. E.g., a first capping layer and a second capping layer are disposed between the cathode 114 and the encapsulation layer 116. Each of the embodiments described herein may include one or more capping layers disposed between the cathode 114 and the encapsulation layer 116. The first capping layer may include an organic material. The second capping layer may include an inorganic material, such as lithium fluoride. The first capping layer and the second capping layer may be deposited by evaporation deposition. In another embodiment, the first sub-pixel circuit 100A further includes at least a global passivation layer disposed over the overhang structure 110 and the encapsulation layer 116. In yet another embodiment, the sub-pixel includes an intermediate passivation layer disposed over the overhang structures 110 of each of the sub-pixels 106, and disposed between the encapsulation layer 116 and the global passivation layer.

Figure 1C:
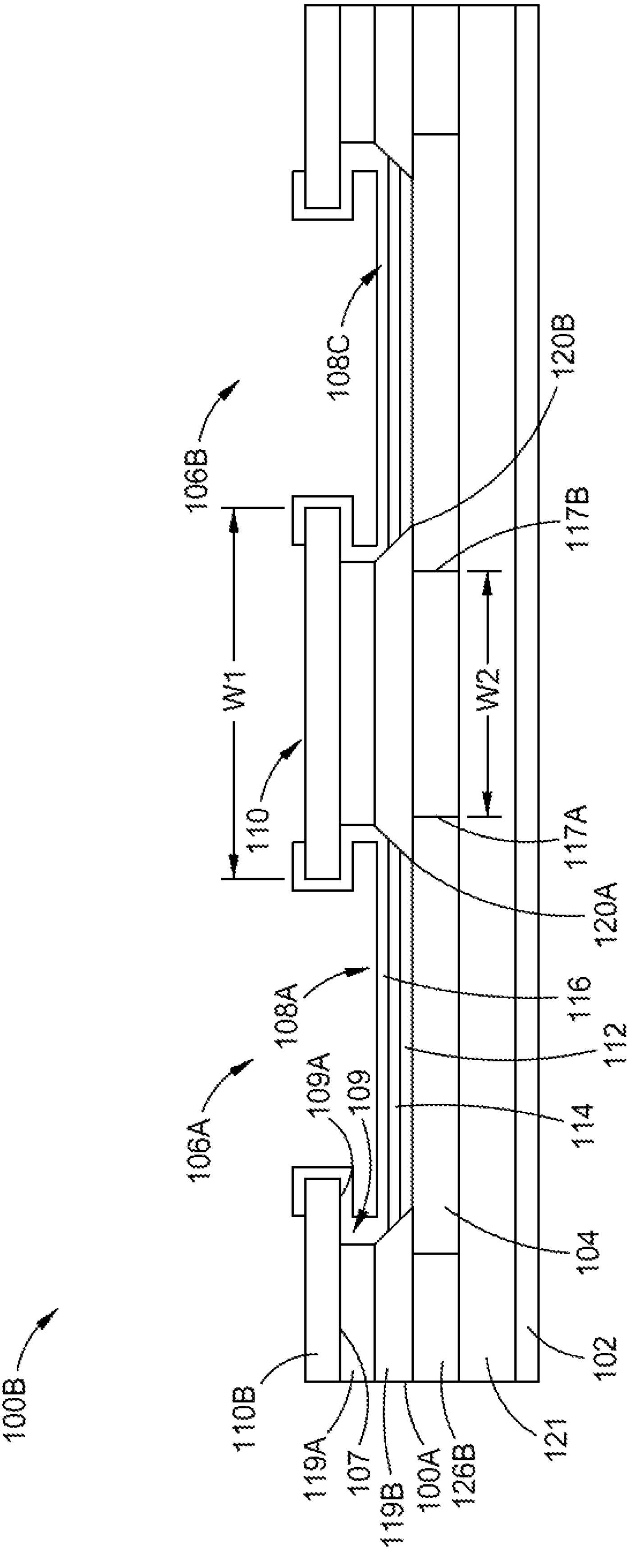
FIG. 1C is a schematic, cross-sectional view of a sub-pixel circuit according to embodiments.
Figure 1D:
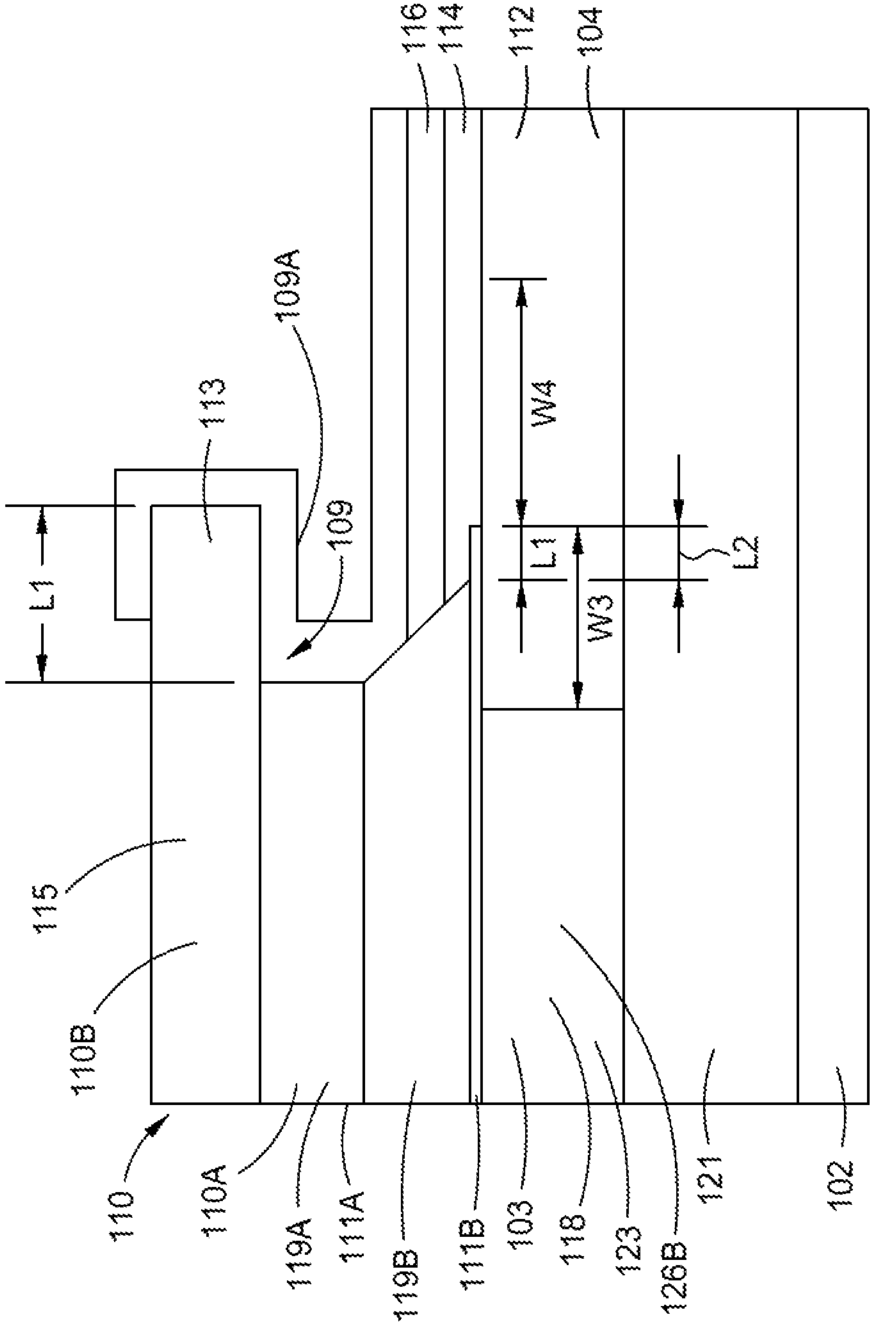
FIG. 1D is a schematic, cross-sectional view of an overhang structure of a sub-pixel circuit according embodiments.

FIG. 1C is a schematic, cross-sectional view of a second sub-pixel circuit 100B according to embodiments. FIG. 1D is a schematic, cross-sectional view of the second sub-pixel circuit 100B according to embodiments. The second sub-pixel circuit 100B includes a substrate 102. A base layer 121 may be patterned over the substrate 102. The base layer 121 includes, but is not limited to, a CMOS layer. Metal-containing layers 104 (e.g., anodes) may be patterned on the base layer 121 and are defined by adjacent pixel structures (PS) 126B disposed on the substrate 102. In one embodiment, the metal-containing layer 104 are pre-patterned on the base layer 121. E.g., the base layer 121 is pre-patterned with metal-containing layer 104 of indium tin oxide (ITO). The metal-containing layer 104 may be disposed over the substrate 102. The metal-containing layer 104 are configured to operate as anodes of respective sub-pixels. In one embodiment, the metal-containing layer 104 is a layer stack of a first transparent conductive oxide (TCO) layer, a second metal-containing layer disposed on the first TCO layer, and a third TCO layer disposed on the second metal-containing layer. The metal-containing layer 104 include, but are not limited to, chromium, titanium, gold, silver, copper, aluminum, ITO, a combination thereof, or other suitably conductive materials.

The PS 126B are disposed over the substrate 102. The PS 126B may be disposed on the base layer 121. The PS 126B include one of an organic material, an organic material with an inorganic coating disposed thereover, or an inorganic material. The organic material of the PS 126B includes, but is not limited to, polyimides. The inorganic material of the PS 126B includes, but is not limited to, silicon oxide ($SiO_2$), silicon nitride ($Si_3N_4$), silicon oxynitride ($Si_2N_2O$), magnesium fluoride ($MgF_2$), or combinations thereof. Adjacent PS 126B define a respective sub-pixel and expose the metal-containing layer 104 of the respective sub-pixel circuit 100. The PS 126B has a width W2. The width W2 is about 800 nm to about 1600 nm, such as about 1200 nm.

The sub-pixel circuit 100B has a plurality of sub-pixel lines (e.g., first sub-pixel line 106A and second sub-pixel line 106B). The sub-pixel lines are adjacent to each other along the pixel plane. Each sub-pixel line includes at least two sub-pixels. E.g., the first sub-pixel line 106A includes a first sub-pixel 108A and a second sub-pixel (not shown) and the second sub-pixel line 106B includes a third sub-pixel 108C and a fourth sub-pixel (not shown). While FIG. 1C depicts the first sub-pixel line 106A and the second sub-pixel line 106B, the second sub-pixel circuit 100B of the embodiments described herein may include two or more sub-pixel lines, such as a third sub-pixel line and a fourth sub-pixel. Each sub-pixel line has OLED materials configured to emit a white, red, green, blue or other color light when energized. E.g., the OLED materials of the first sub-pixel line 106A emits a red light when energized, the OLED materials of the second sub-pixel line 106B emits a green light when energized, the OLED materials of a third sub-pixel line emits a blue light when energized, and the OLED materials of a fourth sub-pixel emits another color light when energized. The OLED materials within a pixel line may be configured to emit the same color light when energized. E.g., the OLED materials of the first sub-pixel 108A and the second sub-pixel of the first sub-pixel line 106A emit a red light when energized and the OLED materials of the third sub-pixel 108C and the fourth sub-pixel of the second sub-pixel line 106B emit a green light when energized.

Each sub-pixel line includes adjacent overhang structures 110, with adjacent sub-pixel lines sharing the adjacent overhang structures 110. The overhang structures 110 are permanent to the sub-pixel circuit 100. The overhang structures 110 further define each sub-pixel line of the sub-pixel circuit 100. Each overhang structure 110 includes adjacent overhangs 109. The adjacent overhangs 109 are defined by an overhang extension 109A of a second structure 110B extending laterally past an upper surface 105 of a first structure 110A. The second structure 110B has a width W1 of about 800 nm to about 1600 nm, such as about 1200 nm. A lower surface 118 of the first structure 110A is disposed over the substrate 102. In some embodiments, the lower surface 118 of the first structure 110A is disposed over an upper surface 103 of the PS 126B. A first endpoint 120A of a lower surface 118 of the first structure 110A may extend to or past the first edge 117A of the PS 126B. A second endpoint 120B of the lower surface 118 of the first structure 110A may extend to or past the second edge 117B the PS 126B.

The second structure 110B may also be disposed over an intermediate structure. The intermediate structure may be disposed over the upper surface 105 of the first structure 110A. The intermediate structure may be a seed layer or an adhesion layer. The seed layer functions as a current path for the sub-pixel circuit 100. The seed layer may include a titanium (Ti) material. The adhesion promotion layer improves adhesion between the first structure 110A and the second structure 110B. The adhesion layer may include a chromium (Cr) material.

In one embodiment, the overhang structures 110 include the second structure 110B of a conductive inorganic material and the first structure 110A of a non-conductive inorganic material. The conductive materials of the second structure 110B include a copper (Cu), chromium (Cr) or chromium oxide ($Cr_2O_3$), aluminum (Al), aluminum neodymium (AlNd), molybdenum (Mo), molybdenum tungsten (MoW), titanium (Ti), or combinations thereof. The non-conductive materials of the first structure 110A include amorphous silicon (a-Si), silicon nitride ($Si_3N_4$), silicon oxide ($SiO_2$), silicon oxynitride ($Si_2N_2O$), or combinations thereof.

In another embodiment, the second structure includes inorganic materials. The inorganic materials of the second structure include titanium (Ti), silicon nitride ($Si_3N_4$), silicon oxide ($SiO_2$), silicon oxynitride ($Si_2N_2O$), or combinations thereof. The first structure includes conductive materials. The conductive materials of the first structure 110A include aluminum (Al), aluminum neodymium (AlNd), molybdenum (Mo), molybdenum tungsten (MoW), copper (Cu), or combinations thereof.

In some embodiments, the first structure 110A includes an upper section 119A and a lower section 119B. The upper section 119A is disposed over the lower section 119B. The upper section 119A and the lower section 119B, in some embodiments, have the same thickness. The lower section 119B has a greater width adjacent to the PS 126A and a lesser width adjacent to the upper section 119A. A sidewall 111A of the upper section 119A and a sidewall 111B of the lower section 119B may be sloped or curved.

The upper section 119A of the first structure 110A is deposited at a first temperature. The first temperature may be from about 100° C. to about 200° C., such as 150° C. The lower section 119B of the first structure 110A is deposited at a second temperature. The second temperature may be from about 250° C. to about 350° C., such as 200° C. The higher deposition temperature of the second silicon material of the lower section 119B may enable a slower etch rate of the lower section 119B of the first structure 110A, resulting in less lateral etching.

In some embodiments, a passivation layer 123 is disposed over the PS 126B. The first structure 110A is disposed over the passivation layer 123. In particular, the lower section 119B of the first structure 110A is disposed over the passivation layer 123. The passivation layer 123 includes a non-conductive material, such as an aluminum oxide, silicon oxide, or a silicon nitride. The passivation layer 123 is configured to prevent etching of the metal-containing layer 104 and the PS 126B during etching of the overhang structure 110. The passivation layer 123 extends a distance D3 past the edge of the first edge 117A and second edge 117B of the PS 126B. The distance D3 is about 100 nm to about 300 nm, such as about 200 nm.

In one embodiment, an OLED material 112 is disposed over and in contact with the metal-containing layer 104. In one embodiment, the OLED material 112 is different from the material of the first structure 110A and the second structure 110B. The overhang structures 110 provide for a shadowing effect during deposition at an angle. Deposition angles are set by the deposition source. The deposition source may be an evaporation source. The OLED material 112 and cathode 114 are deposited via evaporation deposition.

The adjacent overhangs 109 are defined by the overhang extension 109A. At least a bottom surface 107 of the second structure 110B is wider than the upper surface 105 of the first structure 110A to form the overhang extension 109A. The bottom surface 107 of the second structure 110B extends a distance D1 past the upper surface 105 of the first structure 110A, and extends a distance D2 past the edge of the lower surface 118 of the first structure 110A. The distance D1 is greater than about 150 nm, such as from about 150 nm to about 200 nm, such as about 170 nm. In some embodiments, the distance D2 is less than about 50 nm, such as less than about 10 nm, such as less than about 5 nm. In some embodiments, the distance D2 is 0 nm, e.g., the lower surface 118 of the first structure 110A extends a distance past the upper surface 105 of the first structure 110A equal to D1. The distance D1 enables a disconnection between the OLED material 112 and cathode 114 deposited on the upper surface 115 of the second structure 110B and the OLED material 112 and cathode 114 deposited on the sidewall 111B of the first structure 110A. The disconnection reduces the likelihood of an anode-cathode short near the overhang structures 110.

The overhang extension 109A of the second structure 110B forms the overhang 109 and allows for the second structure 110B to shadow the first structure 110A. The shadowing of the overhang 109 provides for evaporation deposition of an OLED material 112 and a cathode 114. The OLED material 112 may include one or more of a HIL, a HTL, an EML, and an ETL. The OLED material 112 is disposed over and in contact with the metal-containing layer 104. The OLED material 112 is disposed under adjacent overhangs 109 and may contact a sidewall 111A and a sidewall 111B of the first structure 110A. In one embodiment, the OLED material 112 is different from the material of the first structure 110A, the second structure 110B, and the intermediate structure. The cathode 114 is disposed over the OLED material 112 and extends under the adjacent overhangs 109. The cathode 114 extends past an endpoint of the OLED material 112. The cathode 114 contacts the sidewall 111A and 111B of the first structure 110A. The overhang structures 110 and an evaporation angle set by an evaporation source define deposition angles, i.e., the overhang structures provide for a shadowing effect during evaporation deposition with the evaporation angle set by the evaporation source The deposition profile of the OLED material 112 and the cathode 114 may decrease beginning at a distance D4 from the edge of the second structure 110B as the deposition approaches the overhang structures 110. The distance D4 is about 100 nm to about 300 nm from the edge of the bottom surface 107 of the second structure 110B, such as about 200 nm from the edge of the bottom surface 107 of the second structure 110B. The overhang structure 110 of this disclosure minimizes the change in the deposition profile of the OLED material and the cathode 114 as the deposition approaches the overhang structures 110, which reduces the change of leakage within the first sub-pixel circuit 100A.

The cathode 114 includes a conductive material, such as a metal. E.g., the cathode 114 includes, but is not limited to, silver, magnesium, chromium, titanium, aluminum, ITO, or a combination thereof. In one embodiment, material of the cathode 114 is different from the material of the first structure 110A, the second structure 110B, and intermediate structure. In some embodiments, e.g., as shown in FIG. 1C as applied to the sub-pixel circuit 100, the OLED material 112 and the cathode 114 are disposed over a sidewall 113 of the second structure 110B of the overhang structures 110 in the pixel plane. In other embodiments, the OLED material 112 and the cathode 114 are disposed over an upper surface 115 of the second structure 110B of the overhang structures 110 in the pixel plane. In still other embodiments, the OLED material 112 and the cathode 114 end on the sidewall 111 of the first structure 110A, i.e., are not disposed over the sidewall 113 of the second structure 110B or the upper surface 115 of the second structure 110B in the pixel plane. In some embodiments, the OLED material 112 and the cathode are disposed over the upper surface 115 of the second structure 110B and a sidewall 113 of the second structure 110B.

Each sub-pixel 106 includes an encapsulation layer 116. The encapsulation layer 116 may be or may correspond to a local passivation layer. The encapsulation layer 116 of a respective sub-pixel is disposed over the cathode 114 (and OLED material 112) with the encapsulation layer 116 extending under at least a portion of each of the overhangs 109 and along a sidewall 111 of the first structure 110A and a sidewall 113 of the second structure 110B. The encapsulation layer 116 is disposed over the cathode 114 and extends at least to contact the cathode 114 over the sidewall 111 of the first structure 110A in the pixel plane. In some embodiments, the encapsulation layer 116 extends to contact the sidewall 111 of the first structure 110A. In some embodiments, the encapsulation layer 116 extends to contact the second structure 110B at an underside surface of the overhang extension 109A, the sidewall 113 of the second structure 110B, and the upper surface 115 of the second structure 110B. In some embodiments, the encapsulation layer 116 extends to contact the second structure 110B at an underside surface of the overhang extension 109A and to be disposed over the OLED material 112 and the cathode 114 when the OLED material 112 and the cathode 114 are disposed over the sidewall 113 and upper surface 115 of the second structure 110B. In some embodiments, the encapsulation layer 116 ends at the sidewall 111 of the first structure 110A, i.e., is not disposed over the sidewall 113 of the second structure 110B, the upper surface 115 of the second structure 110B, or the underside surface of the overhang extension 109A of the overhang structures 110. The encapsulation layer 116 includes the non-conductive inorganic material, such as the silicon-containing material. The silicon-containing material may include $Si_3N_4$ containing materials.

Each sub-pixel line may include adjacent separation structures, with adjacent sub-pixels sharing the adjacent separation structures in the line plane. The separation structures are permanent to the sub-pixel circuit 100. The separation structures further define each sub-pixel of the sub-pixel line of the sub-pixel circuit 100. The separation structures are disposed over an upper surface 103 of the PS 126B.

The OLED material 112 is disposed over and in contact with the metal-containing layer 104 and the separation structure in the line plane. The cathode 114 is disposed over the OLED material 112 in the line plane. The encapsulation layer 116 is disposed over the cathode 114 in the line plane. The OLED material 112, the cathode 114, and the encapsulation layer 116 maintain continuity along the length of the line plane in order to apply current across each sub-pixel 106.

In embodiments including one or more capping layers, the capping layers are disposed between the cathode 114 and the encapsulation layer 116. E.g., a first capping layer and a second capping layer are disposed between the cathode 114 and the encapsulation layer 116. Each of the embodiments described herein may include one or more capping layers disposed between the cathode 114 and the encapsulation layer 116. The first capping layer may include an organic material. The second capping layer may include an inorganic material, such as lithium fluoride. The first capping layer and the second capping layer may be deposited by evaporation deposition. In another embodiment, the second sub-pixel circuit 100B further includes at least a global passivation layer disposed over the overhang structure 110 and the encapsulation layer 116. In yet another embodiment, the sub-pixel includes an intermediate passivation layer disposed over the overhang structures 110 of each of the sub-pixels 106, and disposed between the encapsulation layer 116 and the global passivation layer.

Figure 2:
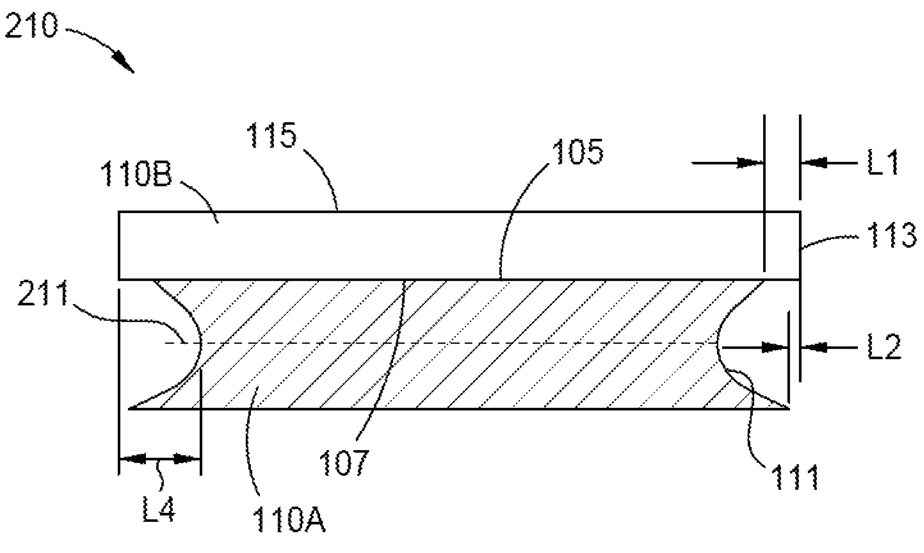
FIG. 2 is a schematic, cross-sectional view of an overhang structure according to embodiments.

FIG. 2 is a schematic, cross-sectional view of an overhang structure 210. The first structure 110A has a greater width adjacent to the second structure 110B and a greater width adjacent to the PS 126B when compared to the width at a plane 211 of the sidewall 111 of the first structure 110A (e.g., the upper surface 105 of the first structure 110A has a width greater than the width at the plane 211, and the lower surface 118 of the first structure 110A has a width greater than the width at the plane 211). The plane 211 of the sidewall 111, in some embodiments, is the portion of the first structure 110A that has a minimum width. The sidewall 111 of the first structure 110A may be shaped like an hourglass. The bottom surface 107 of the second structure 110B extends a distance D5 from the plane 211 of the first structure 110A. The distance D5 is about 50 nm to about 150 nm, such as about 100 nm. The bottom surface 107 of the second structure extends a first distance D1 past the upper surface 105 of the first structure 110A and extends a distance D2 past the lower surface 118 of the first structure 110A. The distance D1 is about 30 nm to about 90 nm, such as about 60 nm. The distance D2 is less than about 50 nm, such as less than about 10 nm, such as less than about 5 nm. In some embodiments, the distance D2 is 0 nm, e.g., the lower surface 118 of the first structure 110A extends a distance past the upper surface 105 of the first structure 110A equal to D1. In some embodiments, the overhang structure 210 of FIG. 2A is not disposed over a passivation layer 123. The overhang structure 210 enables a disconnection between the OLED material 112 and cathode 114 deposited on the upper surface 115 of the second structure 110B and the OLED material 112 and cathode 114 deposited on the sidewall 111B of the first structure 110A. The disconnection reduces the likelihood of an anode-cathode short near the overhang structures 210. Further, the change in the deposition profile of the OLED material 112 and the cathode 114 near the overhang structure 210 is minimized by the overhang structure 210, which reduces the change of leakage within the sub-pixel circuit.

Figure 3:
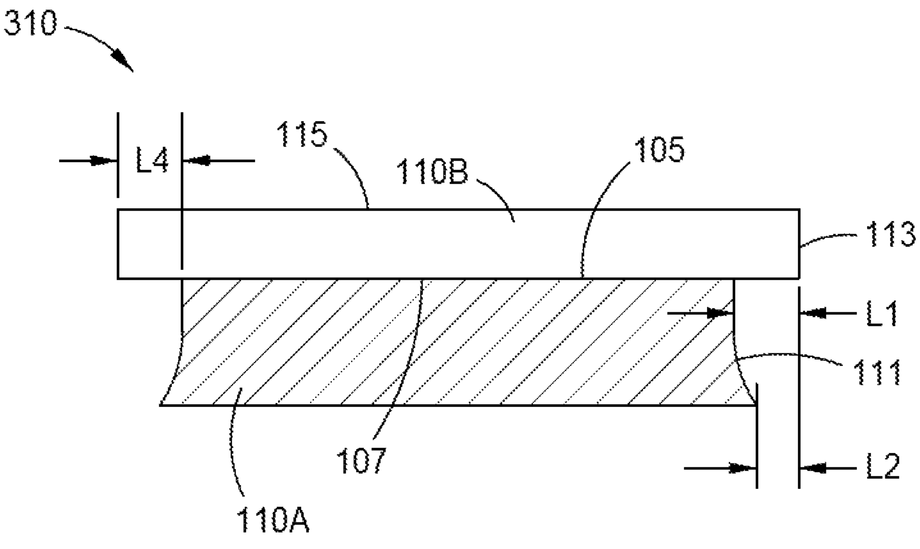
FIG. 3 is a schematic, cross-sectional view of an overhang structure according to embodiments.

FIG. 3 is a schematic, cross-sectional view of an overhang structure 310. The first structure 110A has a lesser width adjacent to the second structure 110B when compared to a width adjacent to the PS 126B (e.g., the width of the lower surface 118 is greater than the width of the upper surface 105). The bottom surface 107 of the second structure extends a first distance D1 past the upper surface 105 of the first structure 110A and extends a distance D2 past the lower surface 118 of the first structure 110A. A distance D1 is maximized to increase the depth of the overhang 109. For example, the distance D1 is about 140 nm to about 200 nm, such as about 170 nm. In some embodiments, the sidewall 111 of the first structure 110A is approximately straight downward, e.g., the distance D2 is about 140 nm to about 200 nm, such as about 170 nm. The overhang structure 310 enables a disconnection between the OLED material 112 and cathode 114 deposited on the upper surface 115 of the second structure 110B and the OLED material 112 and cathode 114 deposited on the sidewall 111B of the first structure 110A. The disconnection reduces the likelihood of an anode-cathode short near the overhang structures 310.

Figure 4:
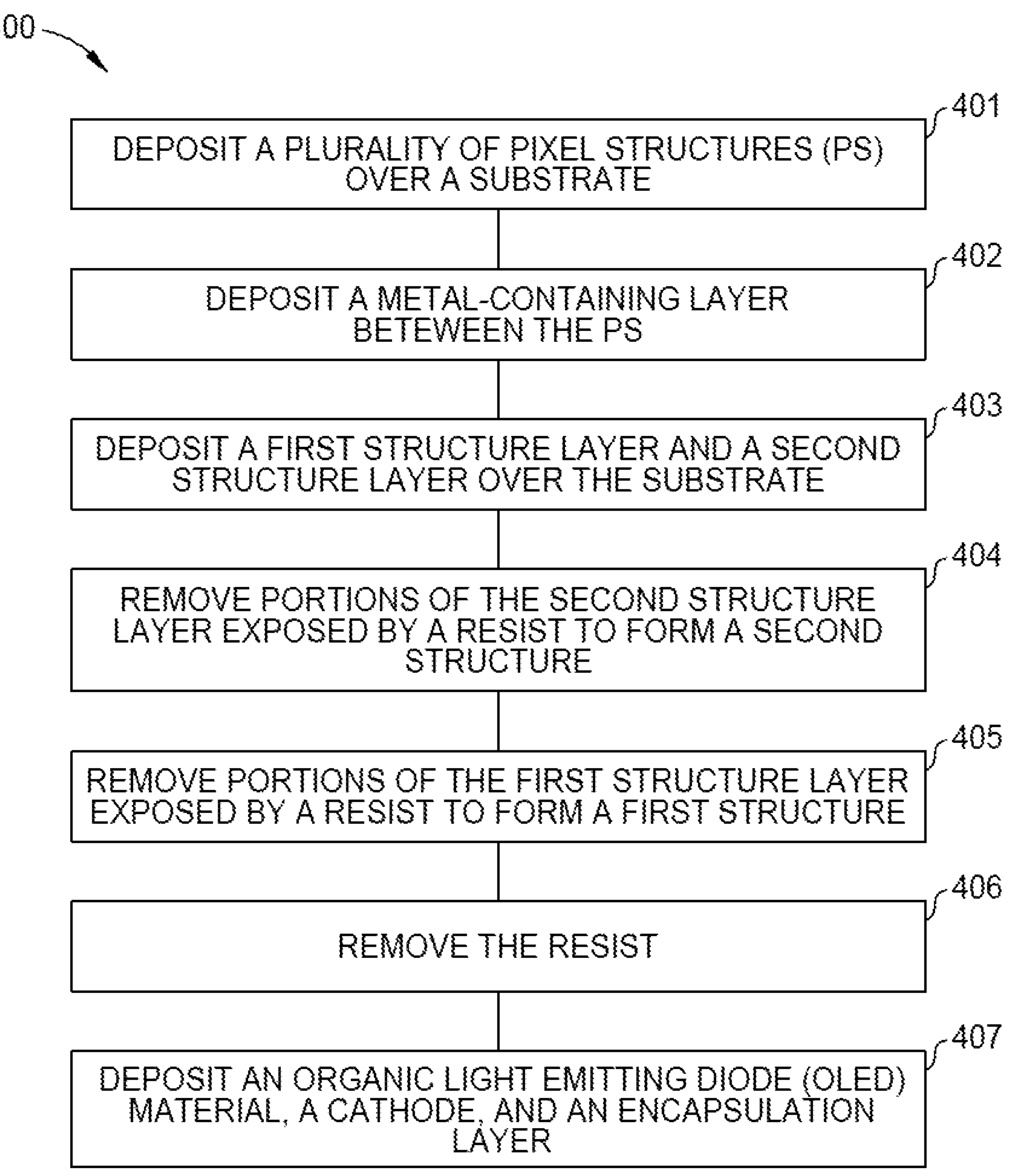
FIG. 4 is a flow diagram of a method for forming a sub-pixel circuit, according to embodiments.

FIG. 4 is a flow diagram of a method 400 for forming a first sub-pixel circuit 100A or a second sub-pixel circuit 100B. FIGS. 5A-5D are schematic, cross-sectional views of a substrate 102 during the method 400 for forming the first sub-pixel circuit 100A or second sub-pixel circuit 100B.

Figure 5A:
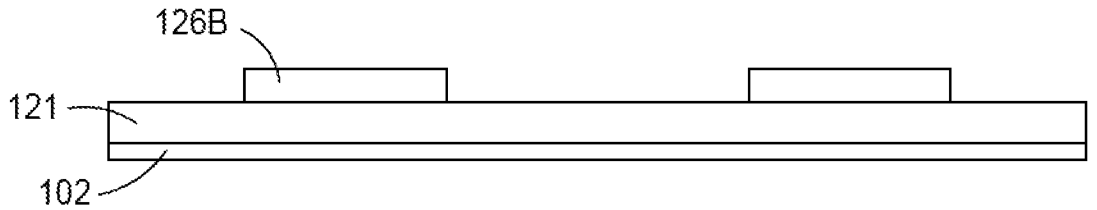
FIG. 5A-5J are schematic, cross-sectional views of a substrate during the method for forming the sub-pixel circuit, according to embodiments.

At operation 401, as shown in FIG. 5A, a plurality of pixel structures (PS) 126B are deposited over a substrate 102. The PS 126B include one of an organic material, an organic material with an inorganic coating disposed thereover, or an inorganic material. The organic material of the PS 126B includes, but is not limited to, polyimides. The inorganic material of the PS 126B includes, but is not limited to, silicon oxide ($SiO_2$), silicon nitride ($Si_3N_4$), silicon oxynitride ($Si_2N_2O$), magnesium fluoride ($MgF_2$), or combinations thereof.

Figure 5B:
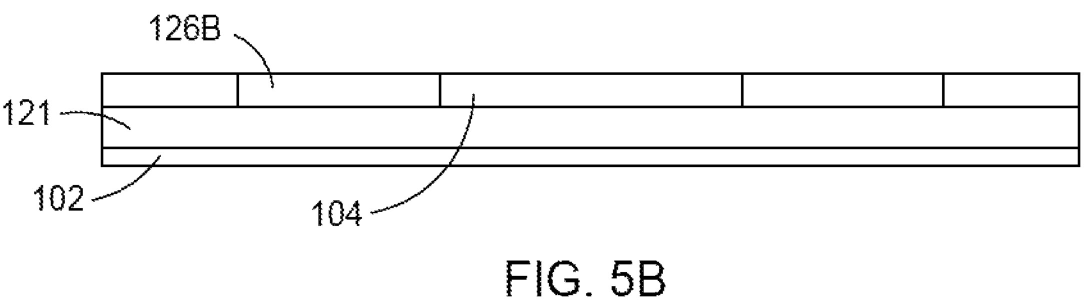

At operation 402, as shown in FIG. 5B, the metal-containing layers 104 are deposited between the PS 126B. The metal-containing layer 104 are configured to operate as anodes of respective sub-pixels. In one embodiment, the metal-containing layer 104 is a layer stack of a first transparent conductive oxide (TCO) layer, a second metal-containing layer disposed on the first TCO layer, and a third TCO layer disposed on the second metal-containing layer. The metal-containing layer 104 include, but are not limited to, chromium, titanium, gold, silver, copper, aluminum, ITO, a combination thereof, or other suitably conductive materials.

Figure 5C:
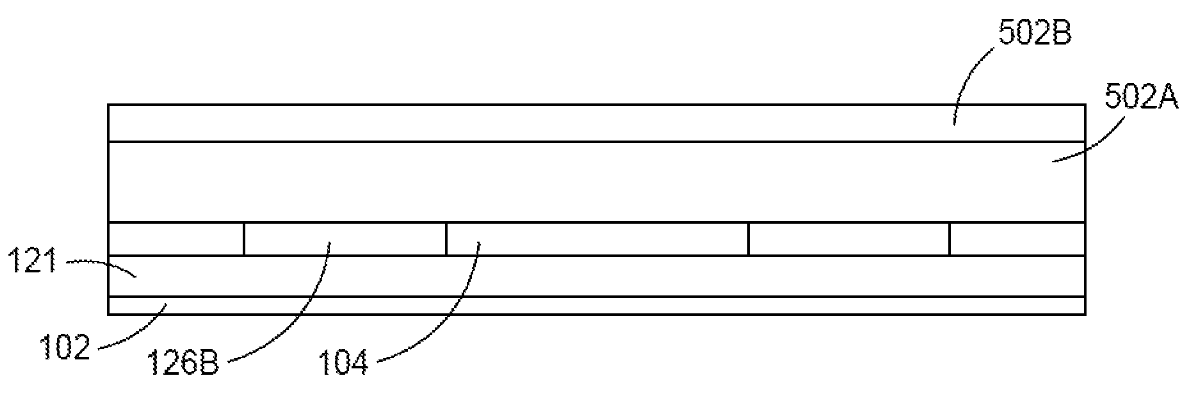

At operation 403, as shown in FIG. 5C, a first structure layer 502A and a second structure layer 502B are deposited over the substrate 102. The first structure layer 502A is disposed over the PS 126B. The second structure layer 502B is disposed over the first structure layer 502A. The first structure layer 502A corresponds to the first structure 110A of the overhang structures 110, 210, and 310, respectively. The second structure layer 502B corresponds to the second structure 110B of the overhang structures 110, 210, and 310. In some embodiments, a passivation layer 123 is disposed between the first structure layer 502A and the substrate 102. In some embodiments, the passivation layer 123 is disposed between the first structure layer 502A and the PS 126B.

In some embodiments, the deposition of the first layer includes forming an upper section layer and a lower section layer. The upper section layer is deposited at a first temperature. The first temperature may be from about 100° C. to about 200° C., such as 150° C. The lower section layer is deposited at a second temperature. The second temperature may be from about 250° C. to about 350° C., such as 200° C.

Figure 5D:
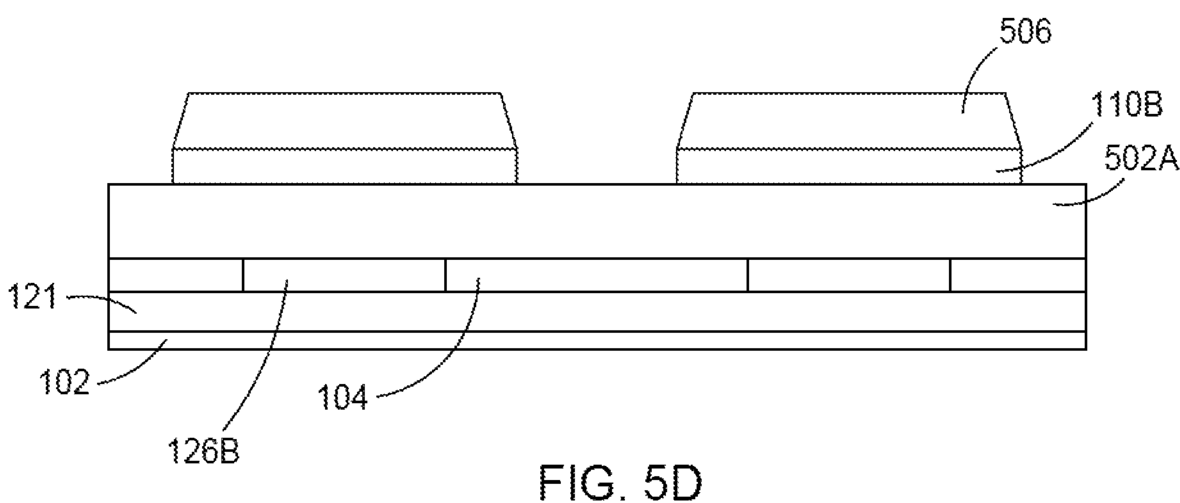

At operation 404, as shown in FIG. 5D, portions of the second structure layer 502B exposed by a resist 506 are removed. The resist 506 is disposed and patterned prior to removing the second structure layer 502B. The resist 506 is disposed over the second structure layer 502B. The resist 506 is a positive resist or a negative resist. A positive resist includes portions of the resist, which, when exposed to electromagnetic radiation, are respectively soluble to a resist developer applied to the resist after the pattern is written into the resist using the electromagnetic radiation. A negative resist includes portions of the resist, which, when exposed to radiation, will be respectively insoluble to the resist developer applied to the resist after the pattern is written into the resist using the electromagnetic radiation. The chemical composition of the resist 506 determines whether the resist is a positive resist or a negative resist. The second structure layer 502B exposed by the resist 506 may be removed by a dry etch process or a wet etch process. In the illustrated embodiment, the operation 404 forms the second structure 110B. In other embodiments, the operation 404 may form the second structure 210B or 310B.

Figure 5E:
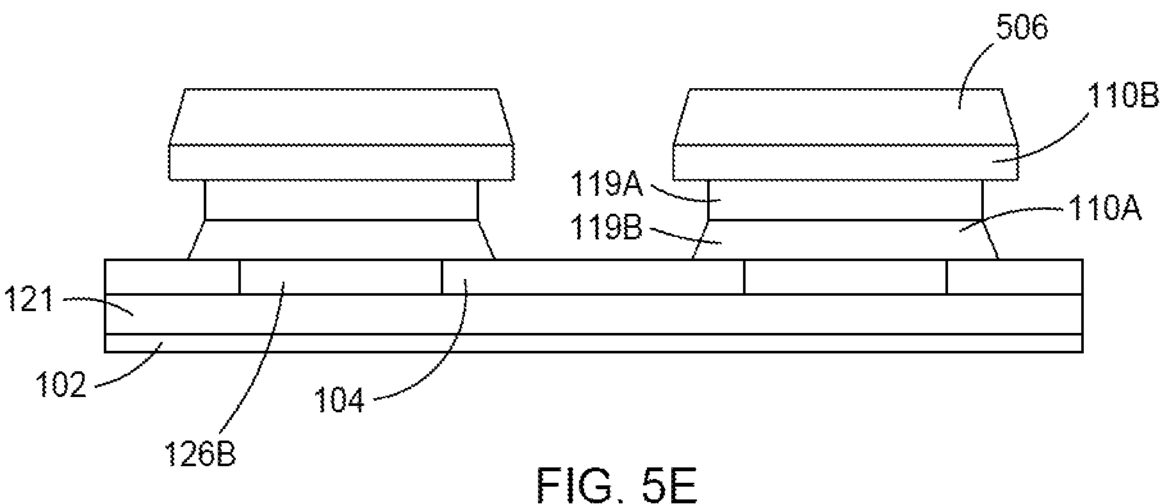
Figure 5F:
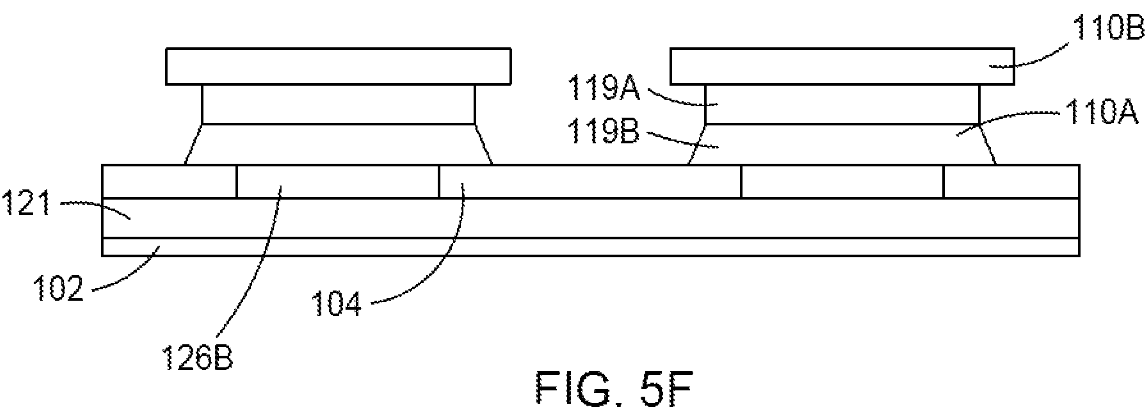
Figure 5G:
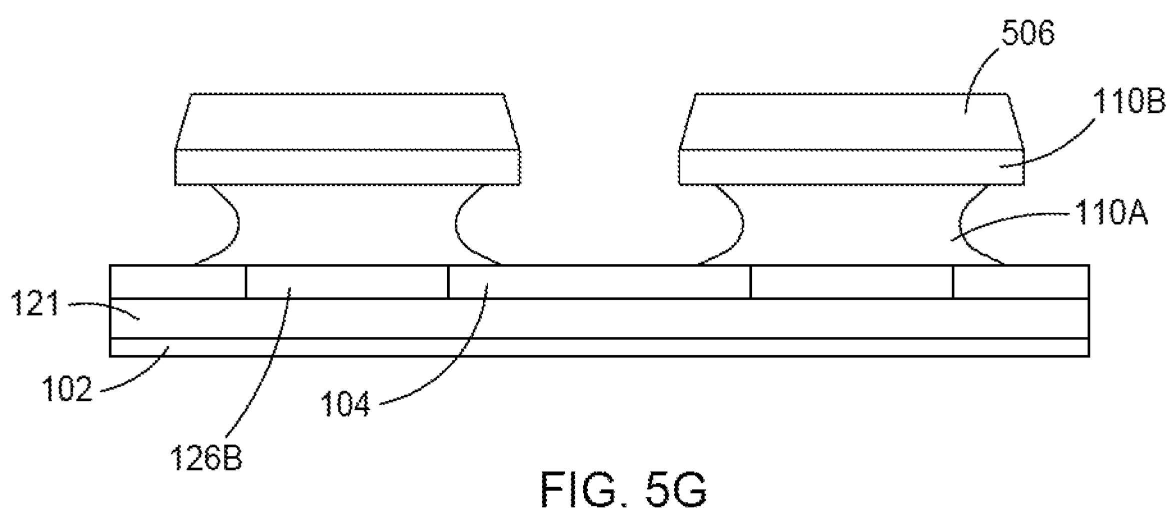
Figure 5H:
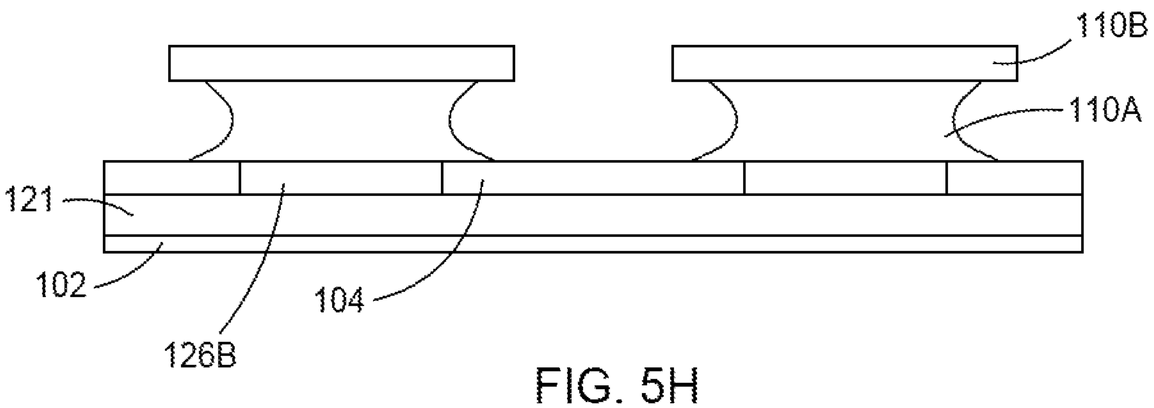
Figure 5I:
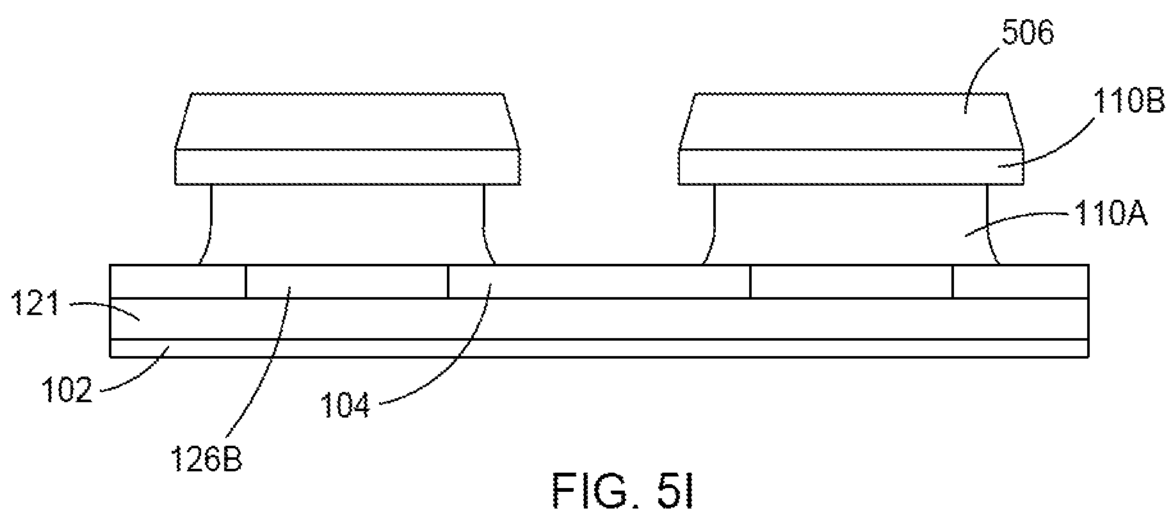

At operation 405, as shown in FIG. 5E, FIG. 5G, and FIG. 5I, portions of the first structure layer 502A exposed by the resist 506 are removed. The first structure layer 502A exposed by the resist 506 may be removed by a dry etch process or a wet etch process. In the illustrated embodiment, the operation 405 forms the first structure 110A of the overhang structures 110. In other embodiments, the operation 405 forms the first structure 210A or 310A of the overhang structures 210 or 310, respectively. The etch selectivity between the materials of the second structure layer 502B corresponding to the second structure 110B, the first structure layer 502A corresponding to the first structure 110A, and the etch processes to remove the exposed portions of the second structure layer 502B and the first structure layer 502A provide for the bottom surface 107 of the second structure 110B being wider than the upper surface 105 of the first structure 110A to form an overhang extension 109A of the overhang 109.

In some embodiments, as shown in FIG. 5E, FIG. 5G, and FIG. 5I, operation 405 forms a first structure 110A. In some embodiments, as shown in FIG. 5E, operation 405 forms an upper section 119A and a lower section 119B of the first structure 110A. The upper section 119A is disposed over the lower section 119B. The upper section 119A and the lower section 119B, in some embodiments, have the same thickness. The lower section 119B has a greater width adjacent to the PS 126A and a lesser width adjacent to the upper section 119A. A sidewall 111A of the upper section 119A and a sidewall 111B the lower section 119B may be sloped or curved. The higher deposition temperature of the lower section layer may enable a slower etch rate of the lower section layer, resulting in less lateral etching when the lower section 119B is formed.

Figure 5J:
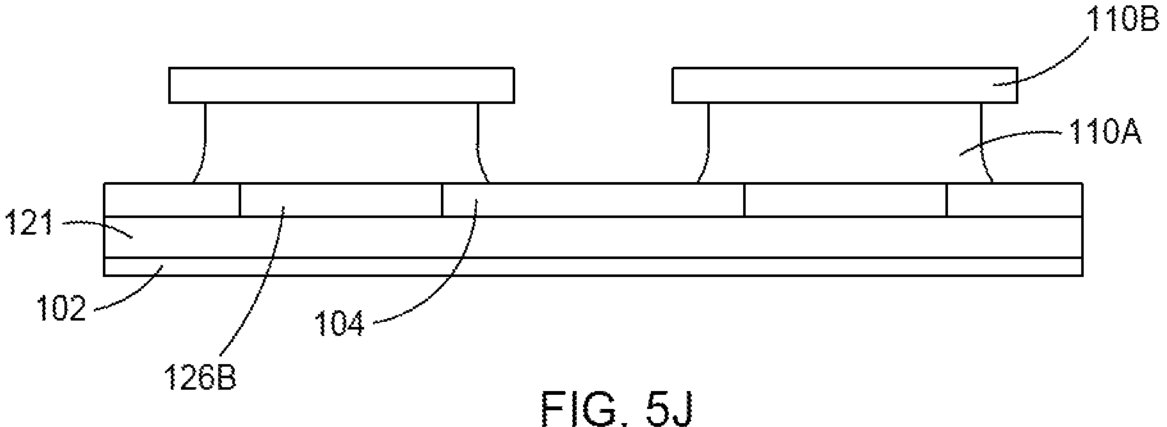

At operation 406, as shown in FIG. 5F, FIG. 5H, and FIG. 5J, the resist 506 is removed from the second structure 110B, leaving behind the overhang structures 110.

At operation 407, an OLED material 112 of the first sub-pixel 108A, a cathode 114, and an encapsulation layer 116 are deposited. The shadowing of the overhang 109 provides for evaporation deposition of each of the OLED material 112 and a cathode 114.

In summation, a device includes a substrate, a plurality of overhang structures disposed over the substrate, and a plurality of sub-pixels. Each overhang structure includes a first structure, a second structure disposed over an upper surface of the first structure, and adjacent overhangs. The first structure includes an upper section and a lower section. The upper section includes a sidewall parallel to a surface normal of the substrate, and an upper surface of the first structure. The lower section includes a top surface with a first width equal to a second width of a lower surface of the upper section and a lower surface of the first structure having a third width greater than the second width of the lower surface of the upper section and extending a first distance past an upper surface of the first structure. The adjacent overhangs are defined by an overhang extension of the second structure extending laterally past the upper surface of the first structure. The overhang extension of the second structure extends a second distance past the upper surface of the first structure. The first distance is equal to the second distance. Each sub-pixel includes an anode, an organic light emitting diode (OLED) material disposed over the anode, and a cathode disposed over the OLED material. The first distance enables a disconnection between the OLED material and cathode deposited on the upper surface of the second structure and the OLED material and cathode deposited on the sidewall of the first structure. The disconnection reduces the likelihood of an anode-cathode short near the overhang structures. Further, the overhang structure minimizes the change in the deposition profile of the OLED material and the cathode as the deposition approaches the overhang structures, which reduces the change of leakage within the first sub-pixel circuit.

While the foregoing is directed to embodiments of the present disclosure, other and further embodiments of the disclosure may be devised without departing from the basic scope thereof, and the scope thereof is determined by the claims that follow.

What is claimed is:

1. A device, comprising:

a substrate;

a plurality of overhang structures disposed over the substrate, each overhang structure having:
a first structure, the first structure comprising:
an upper section, the upper section comprising:
a sidewall parallel to a surface normal of the substrate; and
an upper surface of the first structure;
a lower section, the lower section comprising:
a top surface with a first width equal to a second width of a lower surface of the upper section; and
a lower surface of the first structure having a third width greater than the second width of the lower surface of the upper section and extending a first distance past an upper surface of the first structure;
a second structure disposed over an upper surface of the first structure; and
adjacent overhangs, each overhang defined by an overhang extension of the second structure extending laterally past the upper surface of the first structure, wherein the overhang extension of the second structure extends a second distance past the upper surface of the first structure, wherein the first distance is equal to the second distance; and
a plurality of sub-pixels, each sub-pixel comprising:
an anode;
an organic light emitting diode (OLED) material disposed over the anode; and
a cathode disposed over the OLED material.

2. The device of claim 1, wherein the upper section of the first structure is deposited at a first temperature and the lower section of the first structure is deposited at a second temperature.

3. The device of claim 2, wherein the first temperature is about 100° C. to about 200° C., and the second temperature is about 250° C. to about 350° C.

4. The device of claim 1, wherein an encapsulation layer is disposed over and extends under at least a portion of the overhang.

5. The device of claim 1, wherein the second structure comprises copper (Cu), chromium (Cr), aluminum (Al), aluminum neodymium (AlNd), molybdenum (Mo), molybdenum tungsten (MoW), titanium (Ti), or combinations thereof.

6. The device of claim 1, wherein a passivation layer is disposed over the substrate, and wherein the first structure is disposed over the passivation layer.

7. The device of claim 1, wherein the upper section is an amorphous silicon ($\alpha$-Si) and the lower section is an $\alpha$-Si, a silicon nitride ($SiN_x$), or a silicon oxide ($SiO_2$).

8. A device, comprising:
a substrate;
a plurality of overhang structures disposed over the substrate, each overhang structure having:
a first structure, comprising:
an upper surface;
a lower surface; and
a plane of a sidewall, wherein:
the upper surface has a first width greater than a second width of the first structure at the plane; and
the lower surface has a third width greater than the second width of the first structure at the plane;
a second structure disposed over an upper surface of the first structure; and
adjacent overhangs, each overhang defined by an overhang extension of the second structure extending laterally past an upper surface of the first structure; and
a plurality of sub-pixels, each sub-pixel comprising:
an anode;
an organic light emitting diode (OLED) material disposed over the anode; and
a cathode disposed over the OLED material.

9. The device of claim 8, wherein the overhang extension of the second structure extends a first distance past an upper surface of the first structure, extends a second distance past an edge of a lower surface of the first structure, and extends a third distance from the plane of the sidewall.

10. The device of claim 9, wherein the first distance is about 30 nm to about 90 nm, the second distance is less than about 50 nm, and the third distance is about 50 nm to about 150 nm.

11. The device of claim 8, wherein the second structure comprises copper (Cu), chromium (Cr), aluminum (Al), aluminum neodymium (AlNd), molybdenum (Mo), molybdenum tungsten (MoW), titanium (Ti), or combinations thereof.

12. The device of claim 8, wherein the second structure comprises amorphous silicon (a-Si), silicon nitride ($Si_3N_4$), silicon oxide ($SiO_2$), silicon oxynitride ($Si_2N_2O$), or combinations thereof.

13. The device of claim 8, wherein the overhang structures are disposed over a plurality of pixel structures, and wherein the pixel structures are disposed over the substrate.

14. The device of claim 8, wherein an encapsulation layer is disposed over and extends under at least a portion of the overhang.

15. A device, comprising:
a substrate;
a plurality of overhang structures disposed over the substrate, each overhang structure having:
a first structure, comprising:
an upper surface; and
a lower surface, wherein the lower surface has a width greater than the upper surface;
a second structure disposed over an upper surface of the first structure; and
adjacent overhangs, each overhang defined by an overhang extension of the second structure extending laterally past an upper surface of the first structure; and
a plurality of sub-pixels, each sub-pixel comprising:
an anode;
an organic light emitting diode (OLED) material disposed over the anode; and
a cathode disposed over the OLED material.

16. The device of claim 15, wherein a bottom surface of the second structure extends a first distance past an upper surface of the first structure, and extends a second distance past an edge of a lower surface of the first structure.

17. The device of claim 16, wherein the first distance is about 140 nm to about 200 nm and the second distance is about 140 nm to about 200 nm.

18. The device of claim 15, wherein the second structure comprises copper (Cu), chromium (Cr), aluminum (Al), aluminum neodymium (AlNd), molybdenum (Mo), molybdenum tungsten (MoW), titanium (Ti), or combinations thereof.

19. The device of claim 15, wherein the second structure comprises amorphous silicon (a-Si), silicon nitride ($Si_3N_4$), silicon oxide ($SiO_2$), silicon oxynitride ($Si_2N_2O$), or combinations thereof.

20. The device of claim 15, wherein a passivation layer is disposed over the substrate, and wherein the first structure is disposed over the passivation layer.

* * * * *